(12) United States Patent
Subramanian et al.

(10) Patent No.: US 7,156,925 B1
(45) Date of Patent: Jan. 2, 2007

(54) USING SUPERCRITICAL FLUIDS TO CLEAN LENSES AND MONITOR DEFECTS

(75) Inventors: Ramkumar Subramanian, Sunnyvale, CA (US); Bhanwar Singh, Morgan Hill, CA (US); Khoi A. Phan, San Jose, CA (US); Srikanteswara Dakshina-Murthy, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 158 days.

(21) Appl. No.: 10/978,844

(22) Filed: Nov. 1, 2004

(51) Int. Cl.
*G03B 27/42* (2006.01)
(52) U.S. Cl. .................. 134/1; 355/53; 355/30
(58) Field of Classification Search .............. 134/1, 134/104.3; 355/30, 53
See application file for complete search history.

(56) References Cited

U.S. PATENT DOCUMENTS

| | | | |
|---|---|---|---|
| 5,879,866 A | 3/1999 | Starikov et al. | |
| 5,900,354 A | 5/1999 | Batchelder | |
| 6,309,809 B1 | 10/2001 | Starikov | |
| 6,781,670 B1 | 8/2004 | Krautschik | |
| 6,788,477 B1 | 9/2004 | Lin | |
| 6,809,794 B1 | 10/2004 | Sewell | |
| 2002/0163629 A1 | 11/2002 | Switkes et al. | |
| 2005/0205108 A1* | 9/2005 | Chang et al. | 134/1 |
| 2006/0001851 A1* | 1/2006 | Grant et al. | 355/53 |
| 2006/0028628 A1* | 2/2006 | Lin et al. | 355/30 |

* cited by examiner

*Primary Examiner*—Kiet T. Nguyen
(74) *Attorney, Agent, or Firm*—Amin, Turocy&Calvin LLP

(57) ABSTRACT

Disclosed are immersion lithography methods involving irradiating a first photoresist through a lens and an immersion liquid, the immersion liquid contacting the lens and the first photoresist in a first apparatus; contacting the lens with a supercritical fluid in a second apparatus; and irradiating a second photoresist through the lens and an immersion liquid, the immersion liquid contacting the lens and the second photoresist in the first apparatus.

20 Claims, 3 Drawing Sheets

USING SUPERCRITICAL FLUIDS TO CLEAN LENSES AND MONITOR DEFECTS

TECHNICAL FIELD

The present invention generally relates to improving immersion lithography. More particularly, the present invention relates to using supercritical fluids to clean immersion lithography lenses.

BACKGROUND ART

Conventional photolithography involves projecting actinic radiation onto a photoresist clad wafer. The physical limit to the numerical aperture (NA) for such exposure systems using air as a medium between a lens and the wafer is 1. NA is actually determined by the acceptance angle of the lens and the index of refraction of the medium surrounding the lens. Microscopy has for some time employed oil for resolution enhancement.

Immersion technology offers improved resolution enhancement and higher numerical apertures over conventional projection lithography. In immersion lithography, the space between the projection lens and the wafer in a tool is filled with a liquid. Tat is, immersion lithography uses a thin layer of liquid to further focus resolution. However, immersion lithography typically requires large, expensive lenses.

While the immersion is promising, there are a number of concerns associated with implementing immersion lithography that require resolution in order for the technology to gain wide acceptance. For example, there is a tendency for the liquid in immersion lithography to develop annoying micro-bubbles, which ruins the benefits offered by the technology. Maintaining a consistent bubble free liquid between the lens and the wafer is very difficult. Polarization of the lens is also a significant concern.

Water is the most common liquid employed in current immersion lithography systems. This is because water has an index of refraction of about 1.47, an absorption of less than about 5% at working distances of up to 6 mm, is compatible with most photoresists and lens, and in an ultrapure form, is non-contaminating. Specifically, the liquid employed for most immersion applications is double deionized, distilled, degassed water. Nevertheless, improvements in immersion lithography are desired.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

One aspect of the present invention relates to immersion lithography methods involving irradiating a first photoresist through a lens and an immersion liquid, the immersion liquid contacting the lens and the first photoresist in a first apparatus; contacting the lens with a supercritical fluid in a second apparatus; and irradiating a second photoresist through the lens and an immersion liquid, the immersion liquid contacting the lens and the second photoresist in the first apparatus.

Another aspect of the present invention relates to methods of cleaning an immersion lithography tool by contacting an immersion lithography lens with contaminants thereon with a supercritical fluid for a sufficient period of time to remove substantially all of the contaminants from the immersion lithography lens without damaging the immersion lithography lens.

Another aspect of the present invention relates to automated immersion lithography methods involving irradiating a first photoresist through a lens and an immersion liquid, the immersion liquid contacting the lens and the first photoresist; monitoring accumulation of contaminants on the lens; after contaminants on the lens are detected, contacting the lens with a supercritical fluid to substantially remove contaminants from the lens; and irradiating a second photoresist through the lens and an immersion liquid, the immersion liquid contacting the lens and the second photoresist. The automated methods are facilitated by using monitors, sensors, controllers, processors, and related devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present inventors have discovered that photoresist species may diffuse into an immersion liquid during immersion lithography operations. The diffused photoresist species then are attracted to the lens (in the same or subsequent lithographic operation) preventing some of the actinic radiation from irradiating the photoresist, thereby causing poor pattern formation in the developed photoresist.

The present involves contacting a lens used in an immersion lithography operation with a supercritical fluid. The low surface tension of the supercritical fluid functions to facilitate removal of contaminants that are present on the lens. The lens is then returned to the stepper or immersion lithography tool from which it was removed and another immersion lithography operation can be conducted.

Figure 1:
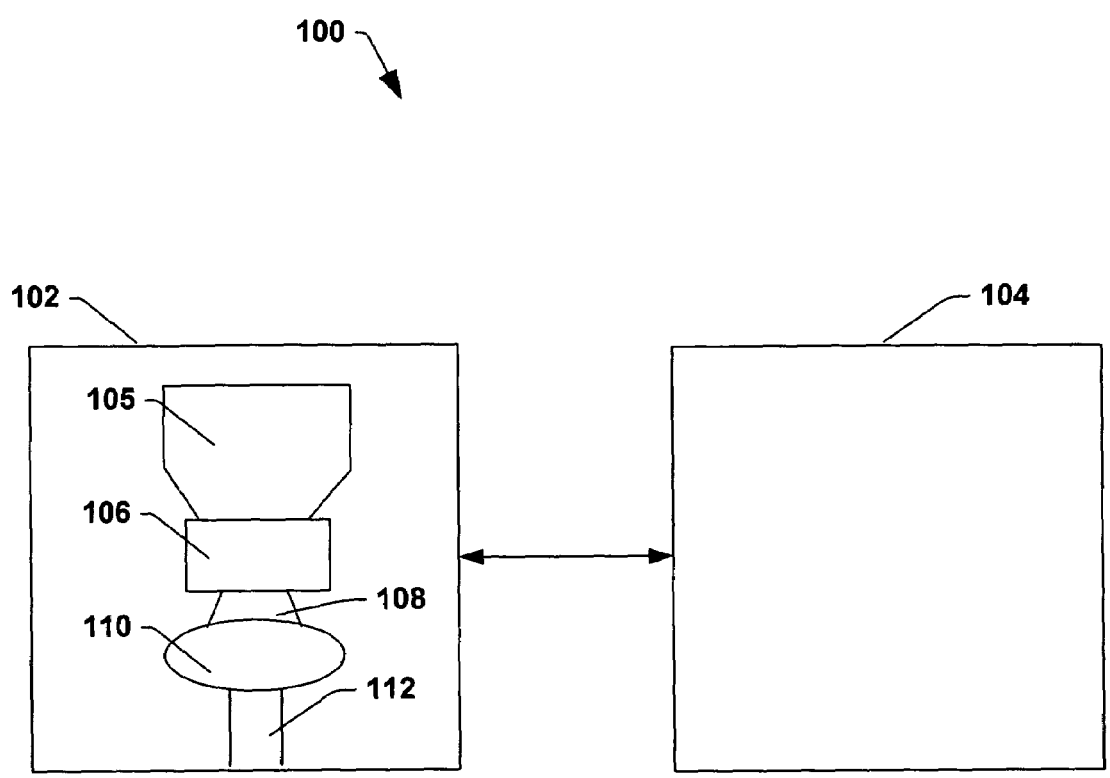
FIG. 1 is a schematic illustration of an immersion lithography system in accordance with one aspect of the present invention.

Referring to FIG. 1, a system 100 and method according to one aspect of the present invention are described. The system 100 includes an immersion lithography tool 102 such as a stepper and a cleaning chamber 104. The immersion lithography tool 102 contains the actinic radiation source 105, lens 106, immersion liquid 108, wafer with a photoresist formed thereon 110, and wafer support 112. The immersion liquid 108 occupies space between the lens 106 and the photoresist of the wafer 110. Actinic radiation is directed through the lens 106 and through the immersion liquid 108 to make an image-wise pattern on the photoresist. After development, the photoresist has a structural pattern analogous to the image-wise pattern of radiation (or a negative thereof).

After a certain number of immersion lithography operations, contamination begins to accumulate on the lens 106, due to photoresist species that diffuse into the immersion liquid 108. Since the contamination physically adheres to the lens 106, changing the immersion liquid 108 is not sufficient to clean the lens. Consequently, the lens 106 is removed from the immersion lithography tool 102 and transported to the cleaning chamber 104. The cleaning chamber 104 can be a supercritical fluid chamber. In the cleaning chamber 104, the lens 106 is contacted with a supercritical fluid to substantially remove or completely remove the contamination that adheres to the lens 106. After cleaning, the lens 106 is simply returned to the immersion lithography tool 102 where additional immersion lithography operations can be conducted.

Describing the action of the present invention more thoroughly, the lens of the lithography tool or stepper is contacted with a supercritical fluid. The supercritical fluid displaces defects, debris, and other unwanted material from the lens, as the supercritical fluid is substantially removed from the lens. A supercritical fluid is a fluid medium that is at a temperature that is sufficiently high that it cannot be liquified by pressure. A supercritical fluid relates to dense gas solutions with enhanced solvation powers, and can include near supercritical fluids. The basis for a supercritical fluid is that at a critical temperature and pressure, the liquid and gas phases of a single substance can co-exist.

The supercritical fluid phenomenon is documented, see pages F-62 to F-64 of the CRC Handbook of Chemistry and Physics, 67th Edition, 1986–1987, published by the CRC Press, Inc., Boca Raton, Fla. At high pressures above the critical point, the resulting supercritical fluid, or "dense gas", attains densities approaching those of a liquid and assumes some of the properties of a liquid. These properties are dependent upon the fluid composition, temperature, and pressure. As used herein, the "critical point" is the transition point at which the liquid and gaseous states of a substance merge with each other and represents the combination of the critical temperature and critical pressure for a given substance.

The compressibility of supercritical fluids is great just above the critical temperature where small changes in pressure result in large changes in the density of the supercritical fluid. The "liquid-like" behavior of a supercritical fluid at higher pressures results in greatly enhanced solubilizing capabilities compared to those of the "subcritical" compound, with higher diffusion coefficients and an extended useful temperature range compared to liquids. An interesting phenomenon associated with supercritical fluids is that as the pressure increases, the solubility of the solute often increases by many orders of magnitude with only a small pressure increase.

Near-supercritical liquids also demonstrate solubility characteristics and other pertinent properties similar to those of supercritical fluids. Fluid "modifiers" can often alter supercritical fluid properties significantly, even in relatively low concentrations. In one embodiment, a fluid modifier is added to the supercritical fluid. These variations are considered to be within the concept of a supercritical fluid as used in the context of this invention. Therefore, as used herein, the phrase "supercritical fluid" also denotes a compound above, at, or slightly below the critical temperature and pressure (the critical point) of that compound.

Examples of compounds which are known to have utility as supercritical fluids are given in Table 1.

TABLE 1

EXAMPLES OF SUPERCRITICAL FLUIDS

| Compound | Boiling Point (C.) | Critical Temperature (C.) | Critical Pressure (atm) | Critical Density (g/cm$^3$) |
|---|---|---|---|---|
| $CO_2$ | −78.5 | 31.3 | 72.9 | 0.448 |
| $NH_3$ | −33.35 | 132.4 | 112.5 | 0.235 |
| $H_2O$ | 100.00 | 374.15 | 218.3 | 0.315 |
| $N_2O$ | −88.56 | 36.5 | 71.7 | 0.45 |
| Xenon | −108.3 | 16.6 | 57.6 | 0.118 |
| Krypton | −153.2 | −63.8 | 54.3 | 0.091 |
| Methane | −164.00 | −82.1 | 45.8 | 0.2 |
| Ethane | −88.63 | 32.28 | 48.1 | 0.203 |
| Ethylene | −103.7 | 9.21 | 49.7 | 0.218 |
| Propane | −42.1 | 96.67 | 41.9 | 0.217 |
| Pentane | 36.1 | 196.6 | 33.3 | 0.232 |
| Methanol | 64.7 | 240.5 | 78.9 | 0.272 |
| Ethanol | 78.5 | 243.0 | 63.0 | 0.276 |
| Isopropanol | 82.5 | 235.3 | 47.0 | 0.273 |
| Isobutanol | 108.0 | 275.0 | 42.4 | 0.272 |
| $CClF_3$ | −31.2 | 28.0 | 38.7 | 0.579 |
| $CFH_3$ | −78.4 | 44.6 | 58.0 | 0.3 |
| Cyclohexanol | 155.65 | 356.0 | 38.0 | 0.273 |

Due to the low cost, environmental acceptability, non-flammability, and low critical temperature of carbon dioxide, nitrous oxide, and water, supercritical carbon dioxide, nitrous oxide and/or $H_2O$ fluid are preferably employed in the present invention.

The supercritical fluid is contacted with the lens in any suitable manner. For example, the lens (and any other portions of the stepper connected to the lens) is present in a high pressure chamber. The chamber is flooded with the compound that forms the supercritical fluid (such as carbon dioxide) in liquid form. The pressure is then increased above the critical pressure, followed by raising the temperature above the critical temperature, thereby converting the compound that forms the supercritical fluid into a supercritical fluid. Next, the pressure is decreased to ambient pressure and the temperature is lowered to room temperature.

Alternatively, after the lens (and any other portions of the stepper connected to the lens) is provided in the high pressure chamber and the chamber is flooded with the compound that forms the supercritical fluid in liquid form, the pressure and temperature are raised simultaneously to the critical temperature and pressure ensuring that the liquid phase of the compound that forms the supercritical fluid remains in liquid form.

The supercritical fluid, after displacing defects, debris, and other unwanted material from the lens, "evaporates", or otherwise is removed from the lens without causing any damage to the lens surface (such as scratching). The supercritical fluid and the contaminants on the lens are removed completely or at least substantially completely. Moreover, since the supercritical fluid is easily and completely removed from the lens, residual immersion liquid concerns on the lens are minimized and/or eliminated (or alternatively, there are inconsequentially small residual amounts). Since residual solvent concerns are minimized, problems such as increased cleaning of the lens are minimized and/or eliminated. The supercritical fluid cleans the lens without damaging the lens (such as causing scratching or pits).

The supercritical fluid is in contact with the immersion lithography lens for a suitable period of time to remove at least substantially all contaminants from the lens. In one embodiment, the supercritical fluid is in contact with the immersion lithography lens for a time from about 0.1 seconds to about 10 minutes. In another embodiment, the supercritical fluid is in contact with the immersion lithography lens for a time from about 0.5 seconds to about 5 minutes. In yet another embodiment, the supercritical fluid is in contact with the immersion lithography lens for a time from about 1 second to about 1 minute.

In many instances, defects, debris, and other unwanted material from photoresists that accumulate on a lens are carbon based materials. Consequently, in one embodiment, one or more carbon containing supercritical fluids is contacted with the immersion lithography lens. Specific examples of carbon containing supercritical fluids include carbon dioxide, methane, ethane, ethylene, propane, pentane, methanol, ethanol, isopropanol, isobutanol, halocarbons, and cyclohexanol.

Figure 2:
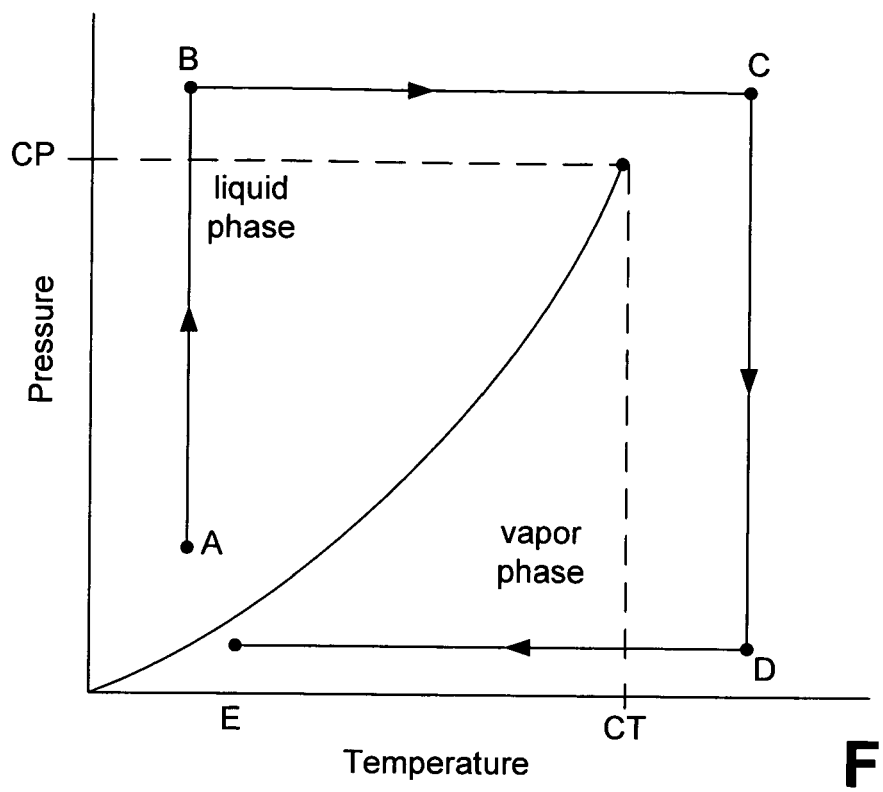
FIG. 2 shows a method of forming a supercritical fluid in the context of a phase diagram according to one aspect of the present invention.

One method of contacting the immersion lithography lens with the supercritical fluid is graphically illustrated in FIG. 2. Referring to FIG. 2, a phase diagram is shown with the pressure on the y-axis and the temperature on the x-axis. The critical temperature is represented by CT and the critical pressure is represented by CP. The line originating at the origin is the liquid-vapor interface. Point A refers to flooding a chamber with the compound that forms the supercritical fluid in liquid form. Increasing the pressure above the critical pressure is shown by the line from point A to point B; raising the temperature above the critical temperature is shown by the line from point B to point C; decreasing the pressure to ambient pressure is shown by the line from point C to point D; and decreasing the temperature to room temperature is shown by the line from point D to point E. Alternatively, any number of acts (a discrete pressure and temperature increase or decrease) may be employed, so long as the liquid-vapor interface line is not crossed.

Figure 3:
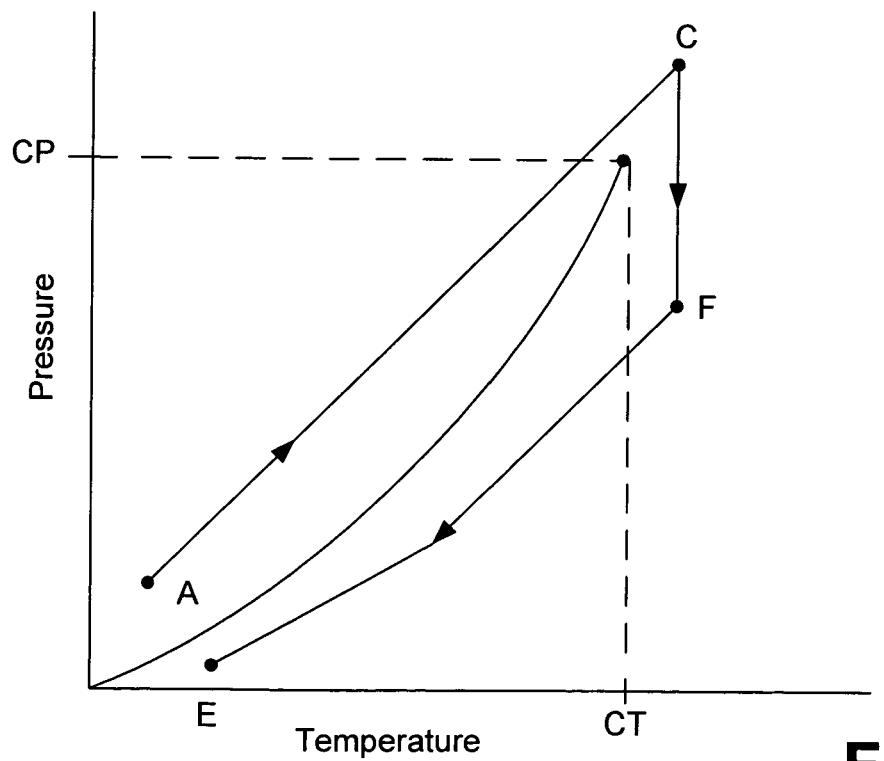
FIG. 3 shows another method of forming a supercritical fluid in the context of a phase diagram according to another aspect of the present invention.

Another method of contacting the immersion lithography lens with the supercritical fluid is graphically illustrated in FIG. 3. Referring to FIG. 3, a phase diagram is shown with the pressure on the y-axis and the temperature on the x-axis, wherein the critical temperature is represented by CT and the critical pressure is represented by CP, and the line originating at the origin is the liquid-vapor interface. Point A refers to flooding a chamber with the compound that forms the supercritical fluid in liquid form. Simultaneously increasing the pressure and temperature above the critical pressure is shown by the line from point A to point C; decreasing the pressure is shown by the line from point C to point F; and simultaneously decreasing the temperature to room temperature and ambient pressure is shown by the line from point F to point E.

Immersion liquids are typically substantially transparent at one or more wavelengths or wavelength bands used as actinic radiation. The immersion liquid does not degrade with exposure to radiation, e.g., the liquid does not become increasingly opaque with increasing exposure. The immersion liquid typically provides low or substantially zero scattering of light projected through the liquid. The immersion liquid fills a space between the lens and the photoresist. The immersion liquid is in optical contact with at least a portion of the lens and at least a portion of a surface of the photoresist, and continuously fills a space between the lens surface and photoresist. The immersion liquid preferably does not substantially interact with the photoresist in a manner that impedes image-wise exposure or subsequent pattern formation. For example, photoresist is not soluble in the immersion liquid, and the immersion liquid does not chemically react with the photoresist.

Examples of immersion liquids suitable for use with this invention include purified water; deionized water; double deionized water; ionized water such as water containing phosphates, and water containing sulfates; cyclo-octane; perfluoropolyethers (PFPE); and the like. The identity of the immersion liquid is not critical to the present invention.

PFPEs are available under the trademarks Fomblin Y®, Fomblin Z®, Demnum™ which are available from the Ausimont Corporation of Thorofare, N.J. and/or from Daikin Corporation of Osaka, Japan; Krytox® available from Dupont Corporation of Wilmington, Del.; and Galden® available from the Ausimont Corporation. Fomblin Y®, Fomblin Z®, Demnum™ have molecular weight ranges from about 1,500 to about 7,250 AMUs (e.g., Fomblin® Y-18); from about 4,000 to about 19,000 AMUs (e.g., Fomblin Z® Z-25); and from about 2,700 to about 8,400 AMUs (e.g., Demnum™ S20 and Demnum™ S200).

Any known wavelength may be employed in the present invention. Typically, the wavelength is about 400 nm or less. Examples of wavelengths suitable for use with this invention include 365 nm, 248 nm, 193 nm, 157 nm, 13 nm, 11 nm, and the like. The identity of the wavelength of the actinic radiation is not critical to the present invention.

The photoesists suitable for use with the present invention have appropriate photosensitivity at the selected wavelength of actinic radiation. Any known photoresist may be employed. The photoesist can be positive or negative. The identity of the photoresist is not critical to the present invention.

The stepper or lithography tool is specifically made for immersion lithography or can be made by re-designing or converting a conventional "dry" (i.e., non-immersion) lithographic tool for use as an immersion lithographic system. For example, projection systems and wafer handling portions of conventional lithographic systems may be modified to accommodate an immersion liquid.

Figure 4:
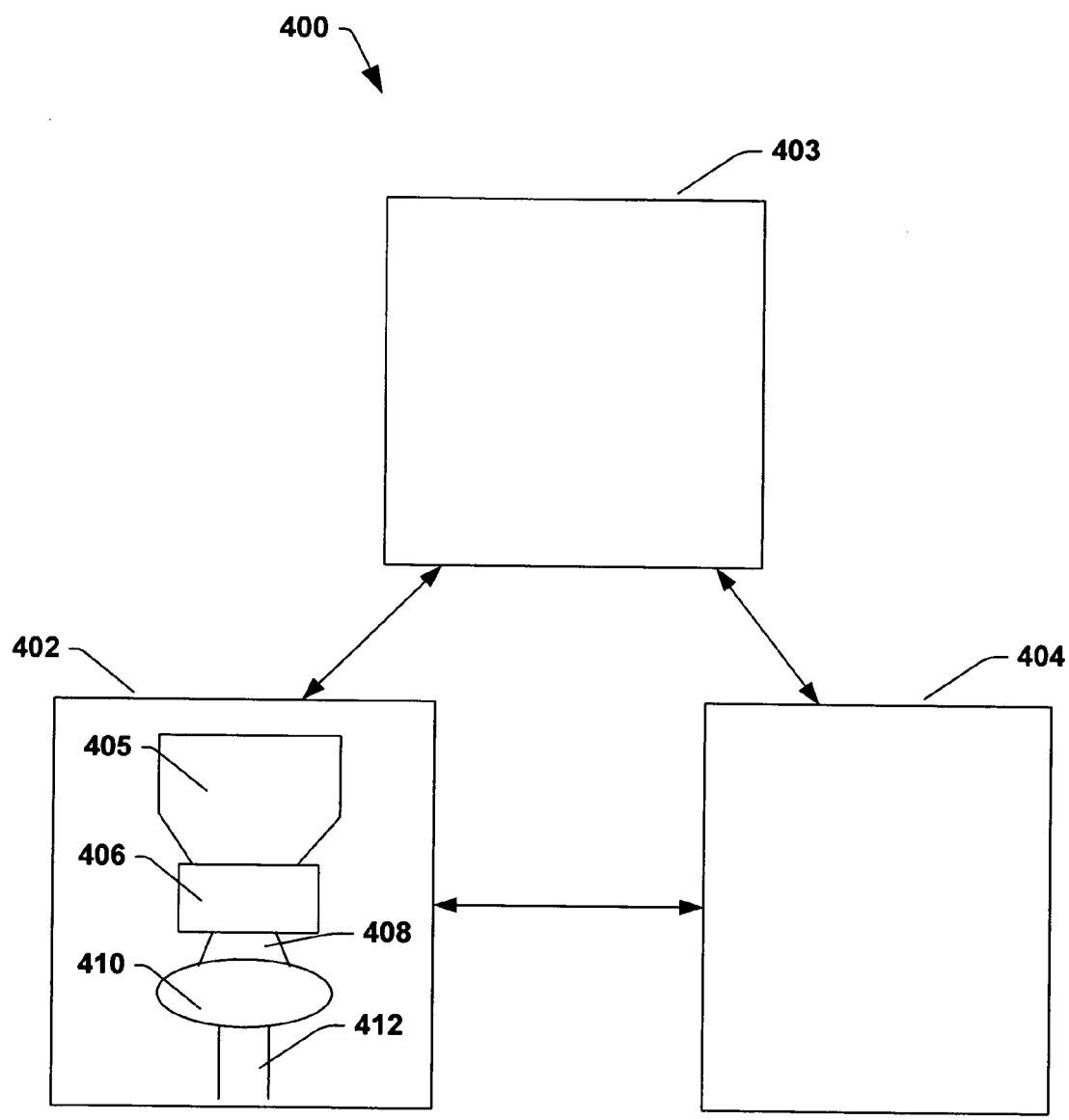
FIG. 4 is a schematic illustration of an immersion lithography system in accordance with another aspect of the present invention.

Referring to FIG. 4, another system 400 and method according to an aspect of the present invention are described. The system 400 includes an immersion lithography tool 402 monitor-controller 403, and a supercritical cleaning chamber 404. The immersion lithography tool 402 projects actinic radiation from an actinic radiation source 405 through a lens 406 and immersion liquid 408 onto a wafer with a photoresist formed thereon 410, held in place by wafer support 412. The immersion liquid 408 occupies space between the lens 406 and the photoresist of the wafer 410. Actinic radiation is projected to form an image-wise pattern on the photoresist. After development, the photoresist has a structural pattern analogous to the image-wise pattern of radiation (or a negative thereof).

The monitor-controller 403 detects the need to clean lens 406, due to photoresist species that diffuse into the immersion liquid 408 and onto lens 406. That is, the monitor-controller 403 may detect contaminants on the lens 406 surface, or in the immersion liquid 408. Once the need to clean is detected by a monitor subcomponent, a control subcomponent induces removal of the lens 406 from immersion lithography tool 402 and directs the lens 406 to supercritical cleaning chamber 404.

Optionally, the monitor-controller 403 may dictate the amount of supercritical fluid that is contacted with the lens 406, based in part on the amount or level of contamination detected on the lens 406. Further, the monitor-controller 403 may optionally dictate the time of contact between the supercritical fluid and the lens 406, an/or any other parameter associated with cleaning the lens 406 based in part on the amount or level of contamination detected on the lens 406. The monitor-controller 403 may initially direct cleaning of the lens 406 based detected amounts of contaminants, or over time may recognize that a certain time interval is typically appropriate to clean the lens 406 based on accumulated data of past instances of cleaning. After cleaning, the lens 406 is simply returned to the immersion lithography tool 402 where additional immersion lithography operations can be conducted.

The monitor-controller 403 can be any device or combination of devices suitable to detect contamination of the lens or the likelihood of contamination on a lens, The lens may be inspected directly by optical, metrological, or chemical means, and/or the immersion liquid may be inspected by optical, metrological, or chemical means. For example, an optical device can detect the presence of contaminants on the lens surface and a chemical sensor can detect the presence of contaminants in the immersion liquid.

The monitor-controller 403 may contain a processor and a memory, both of which are operably coupled to each other. It is to be understood that a that the processor can be a processor dedicated to determining whether contamination is present on the immersion lithography lens, how much contamination has accumulated on the immersion lithography lens, and/or whether the lens is substantially clean, a processor used to control one or more of the components or subcomponents of the present system, or, alternatively, a processor that is used to determine whether cleaning is necessary and to control one or more of the components of the cleaning subsystem. The memory component can be employed to retain lens contamination information, the identity and cleaning abilities of specific supercritical fluids, the number of immersion lithography operations conducted before/after a lens cleaning, and other related data, etc.

The monitoring subcomponent relays information to the control subcomponent, and the control subcomponent operates based on the content of the information (such as the presence of contaminants, the amount of contaminants, the number of immersion lithography operations, and the like).

The monitor-controller 403 may employ various inference schemes and/or techniques in connection with cleaning the immersion lithography lens. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Simply speaking, the monitor-controller 403 may employ inference schemes to automatically clean the immersion lithography lens with a supercritical fluid when, based on past performance of immersion lithography operations, the lens has or is likely to have photoresist contaminants thereon.

The monitor-controller 403 may contain a processor and receive data of pressure and temperature from the supercritical cleaning chamber 404. The processor may be programmed to control and vary the pressure and temperature in the supercritical cleaning chamber 404. A memory in the monitor-controller 403 may serve as a storage medium for temporarily storing information such as chamber pressure, chamber temperature, critical pressure data, critical temperature data, temperature-pressure inter-relationship data, and other data which may be employed in carrying out the present invention. The monitor-controller 403 is coupled to the supercritical cleaning chamber 404 so as to maintain, raise, or lower the pressure and/or temperature within the supercritical cleaning chamber 404. Automated cleaning is thereby enabled by this arrangement.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An immersion lithography method, comprising
   irradiating a first photoresist through a lens and an immersion liquid, the immersion liquid contacting the lens and the first photoresist in a first apparatus;
   contacting the lens with a supercritical fluid in a second apparatus; and
   irradiating a second photoresist through the lens and an immersion liquid, the immersion liquid contacting the lens and the second photoresist in the first apparatus.

2. The method of claim 1, wherein the supercritical fluid comprises at least one selected from the group consisting of ammonia, water, nitrous oxide, xenon, krypton, carbon dioxide, methane, ethane, ethylene, propane, pentane, methanol, ethanol, isopropanol, isobutanol, halocarbons, and cyclohexanol.

3. The method of claim 2, wherein the supercritical fluid contacts the lens for a time from about 1 second to about 1 minute.

4. The method of claim 1, wherein the first photoresist comprises a carbon based material.

5. The method of claim 4, wherein the supercritical fluid comprises at least one carbon containing supercritical fluid.

6. The method of claim 1, wherein irradiating a first photoresist comprises using one of 365 nm, 248 nm, 193 nm, 157 nm, 13 nm, and 11 nm wavelength radiation.

7. The method of claim 1, wherein the immersion liquid comprises at least one selected from the group consisting of purified water; deionized water; double deionized water;

ionized water such as water containing phosphates, and water containing sulfates; cyclo-octane; perfluoropolyethers.

8. The method of claim 1, wherein the supercritical fluid contacts the lens for a time from about 0.1 seconds to about 10 minutes.

9. The method of claim 1, wherein the supercritical fluid has a critical temperature and critical pressure and is formed by providing a composition in a liquid phase in the second apparatus, and simultaneously raising the pressure of the composition above the critical pressure and the temperature above the critical temperature in the second apparatus.

10. The method of claim 9, wherein the supercritical fluid contacts the lens for a time from about 1 second to about 1 minute.

11. The method of claim 1 wherein the supercritical fluid comprises carbon dioxide and the first photoresist comprises a carbon based material.

12. The method of claim 1, wherein the immersion lithography lens contacts the supercritical fluid for a time from about 0.5 seconds to about 5 minutes.

13. The method of claim 1, wherein irradiating the first photoresist comprises using about 400 nm or less wavelength radiation.

14. The method of claim 1, wherein the supercritical fluid comprises ethanol.

15. The method of claim 1, wherein the supercritical fluid comprises isopropanol.

16. The method of claim 1, wherein the supercritical fluid comprises ethane.

17. The method of claim 1, wherein the supercritical fluid comprises methane.

18. The method of claim 1, wherein irradiating the second photoresist comprises using about 400 nm or less wavelength radiation.

19. The method of claim 1, wherein the second photoresist comprises a carbon based material.

20. The method of claim 1, wherein the supercritical fluid contacts the lens for a time from about 1 second to about 1 minute.

* * * * *